United States Patent [19]

Scifres et al.

[11] 4,217,561
[45] Aug. 12, 1980

[54] BEAM SCANNING USING RADIATION PATTERN DISTORTION

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[21] Appl. No.: 918,743

[22] Filed: Jun. 26, 1978

[51] Int. Cl.$^2$ ............................................... H01S 3/19
[52] U.S. Cl. .......................... 331/94.5 H; 331/94.5 K
[58] Field of Search ..................... 331/94.5 H, 94.5 K; 357/18

[56] References Cited

U.S. PATENT DOCUMENTS

| | | | |
|---|---|---|---|
| 3,436,679 | 4/1969 | Fenner | 331/94.5 K |
| 3,701,044 | 10/1972 | Paoli et al. | 331/94.5 H |
| 3,702,975 | 11/1972 | Miller et al. | 331/94.5 H |

OTHER PUBLICATIONS

T. Kobayashi et al., "Lasing Characteristics of Very Narrow Planar Stripe Lasers", *Japanese J. of Applied Physics*, vol. 16, No. 4, Apr. 1977, pp. 601–607.
L. A. D'Asaro et al., "Junction Lasers", *Physics Today*, vol. 24, No. 3, Mar. 1971, pp. 42–48.

*Primary Examiner*—James W. Davie
*Attorney, Agent, or Firm*—Leonard Zalman

[57] ABSTRACT

A laser beam scanner in which a single-lobe propogates radiation pattern through an electrically variable asymmetric electrical charge distribution. Because the electrical charge distribution determines the real and imaginary parts of the refractive index of the material through which the radiation pattern propogates the radiation pattern may be deflected by changing the charge distribution profile.

6 Claims, 9 Drawing Figures

BEAM DEFLECTION BY AN ASYMMETRIC
REFRACTIVE INDEX/GAIN PROFILE

BEAM SCANNING USING RADIATION PATTERN DISTORTION

BACKGROUND OF THE INVENTION

One of the prominent goals of integrated optics research has been to combine a variety of optical and electrical components together with a laser source onto a single substrate so as to achieve major advantages in economy and reliability. In particular integrated laser beam deflection or scanning devices are of great practical interest. One type of integrated laser beam scanner described in U.S. Pat. No. 3,701,044 provides a scanned interference fringe pattern, with the interference fringe pattern being provided by adjacent stripe contact geometry semiconductor lasers. These lasers are said to rely on a variable phase relationship between adjacent lasers which produces a multiple lobed output. Only by arranging many lasers (>10) side by side can an appreciable amount of power be concentrated in a single-lobe in that manner. Since fabrication and control of a device with many sources is difficult, an integrated laser beam deflector generating only a single-lobe radiation pattern would be desirable.

OBJECTS OF THE INVENTION

It is an object of the present invention to provide an integrated laser beam scanner.

It is a further object of the present invention to provide an integrated laser beam scanner utilizing a single-lobe radiation pattern.

It is a further object of the present invention to provide a laser beam scanner in which the laser beam propogates through an electrically variable electric charge distribution.

SUMMARY OF THE INVENTION

In accordance with the invention there is disclosed a laser beam scanner in which the laser beam is made to propogate through an asymmetric electrical charge distribution. Deflection occurs because the charge distribution alters the refractive index and gain profile of the material through which the beam propogates and light is bent toward the region of higher index and gain. In one particular configuration dual or multiple conducting stripe contacts overlay a laser active region. The contacts have a close center-to-center spacing which may be on the order of 8 um. One of the conducting stripes is strongly pumped to beyond laser threshold to provide a single lobe radiation output pattern whereas another conducting stripe is weakly pumped at less than laser threshold. The current injected beneath the weakly pumped stripe contact causes the overall charge distribution in the active region beneath the stripes to be asymetric which in turn distorts the radiation pattern of the strongly pumped laser to provide angular emission and scanning in the direction of the distortion. Scanning can also be achieved by pumping both stripe contacts at near or above threshold and varying the ratios of the current to each contact. In addition, reverse biased contacts may be used to change the charge distribution through which a laser beam passes resulting in beam deflection.

DETAILED DESCRIPTION OF THE INVENTION

The present invention relates to a semiconductor laser which can provide an angular scan of a single-lobe radiation pattern of over 28 degrees in the far field with a divergence of at most 6 degrees. The single-lobe characteristics of the laser scanner are different from scanning devices which scan a far field interference pattern as described in the referenced patent. The operating principles of the two lasers are entirely different. In the device of the patent adjustable phase delays are used to generate a scanned interference pattern whereas the invention is directed to distortion of the gain and refractive index distribution of a semiconductor laser to achieve scanning of a single-lobe radiation pattern.

Figure 4:
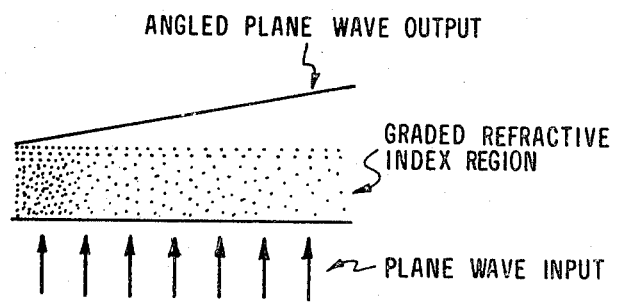
FIG. 4 is a schematic diagram illustrating the principle on which the laser beam scanner is based.

Referring first to FIG. 4, there is shown a simplified schematic diagram of a laser scanner based on radiation distortion. That is, if a plane wave light front or sources, for example, is incident on a region with a graded refractive index, that light wave is bent toward the region of high refractive index/gain as the light wave travels through it. Thus, the light wave emerges from the material at a different angle than that at which it was incident and the wave is said to be scanned.

In a semiconductor crystal the refractive index (both the real and/or imaginary parts) can be varied by the application of a forward bias current into the region of a rectifying junction or by back biasing a rectifying junction. Because this refractive index profile (charge distribution) can be electrically controlled and distorted, the beam of a semiconductor injection laser which is propogating through such a graded refractive index region can be scanned by electrical means.

Figure 1:
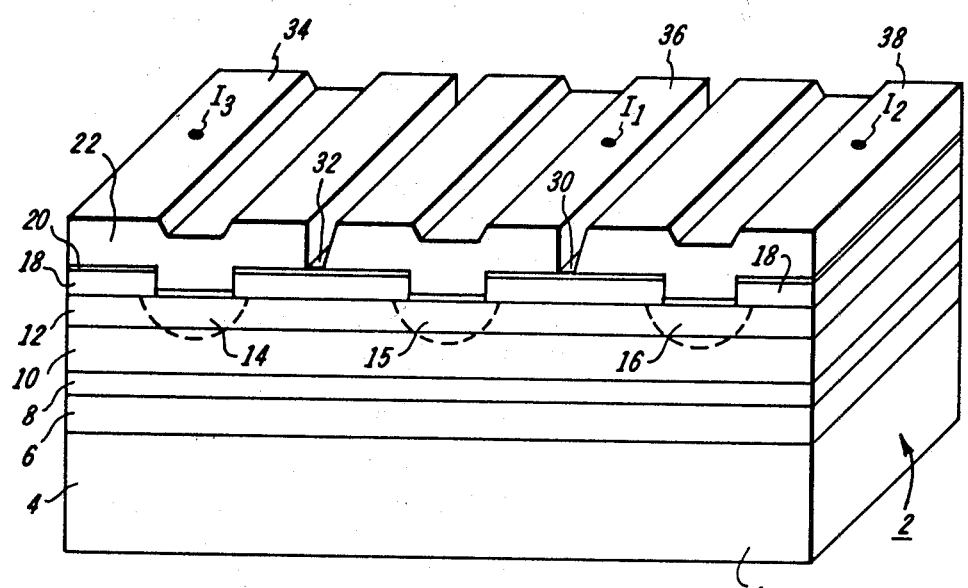
FIG. 1 is a pictorial view of a laser scanner in accordance with the invention.

Referring now to FIG. 1, there is shown a specific embodiment of a laser scanner 2 in accordance with the invention in which a refractive index gradation in the vacinity of the laser beam is provided by a forward biased current injected into an adjacent striped contact. Scanner 2 includes a double hereto junction laser structure including an n-type GaAs substrate 4, an n-type GaAlAs light guiding layer 6, a p-type GaAs or GaAlAs active layer 8, a p type GaAlAs light guiding layer 10, and an n-type GaAs contact facilitating layer 12. Extending through layer 12 to layer 10 are three parallel p-type regions 14, 15 and 16 which extend from the near face of the laser to the far face of the laser. The near and far laser faces are cleaved or mirrored to provide a resonant cavity. Electrically insulating material 18 covers the top surface of layer 12 except for portions of regions 14, 15 and 16. Deposited over insulating material 18 and the portions of regions 14, 15 and 16 not covered by insulating material 18 is a thin film 20 of an electrically conductive material, and deposited over film 20 is a layer 22 of a material which is more conductive than the material of film 20. For example, film 20 can be a Cr film approximately 200 Å thick and layer 22 can be an Au layer approximately 2 um thick.

P-type regions 14, 15 and 16 permit the emissive regions of layer 8 therebeneath to be electrically pumped.

Regions 14, 15 and 16 can be on the order of 2 um wide and can have a center-to-center spacing on the order of 8 um. In order that the emissive regions can be separately pumped, the conductive layer 22 is removed between the emissive regions as shown at 30 and 32 to provide contacts 34, 36, and 38; the thin film 20 may remain or be removed under regions 30 and 32. The depicted structure provides a path with approximately 8 ohms total resistance between adjacent contacts 34 and 36 and 36 and 38 when film 20 is approximately 200 Å thick and a Cr and layer 8 is composed of a 0.2 um thick $Ga_{0.95}Al_{0.05}As$ ($p \sim 1 \times 10^{17}$ $cm^{-3}$), layer 10 is composed of 2 um thick $Ga_{0.5}Al_{0.5}As$ ($p \sim 3 \times 10^{17}$ $cm^{-3}$), and layer 12 is composed of n-GaAs $\sim 0.3$ um thick.

Figure 2A:
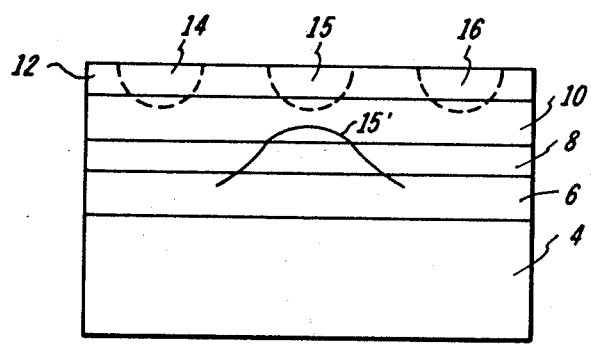
FIGS. 2a, 2b and 2c are plane views showing operational aspects of the scanner of FIG. 1.
Figure 2B:
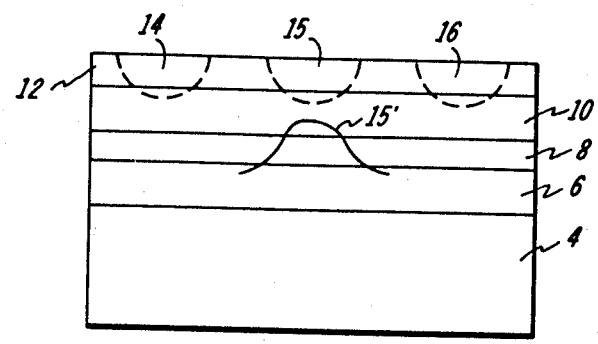
Figure 2C:
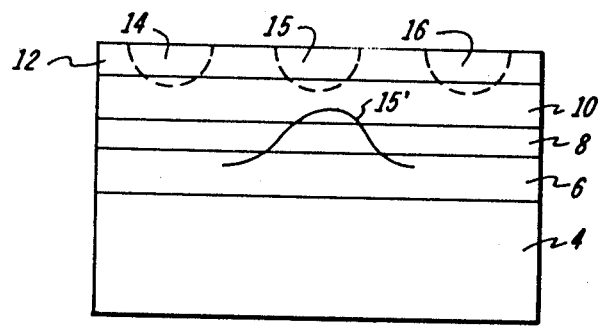

In operation, when electrode 36 receives a current I, which is above threshold and no current is applied to electrodes 34 and 36, the stripe emissive region of layer 8 below stripe region 15 will lase and produce a symmetrical near field readiation pattern 15' as depicted in FIG. 2a because the current distribution and therefore the refractive index through which the beam passes varies uniformly across the beam. As shown, the near field radiation pattern 15 has a gaussian distribution which provides an output beam perpendicular to the near face of the laser. Angular scanning of the radiation pattern 15' is achieved by varying the ratios $I_1/I_2$ and $I_1/I_3$. When $I_2$ is increased from zero to values below threshold (with $I_3$ remaining zero or very small), a portion of $I_2$ leaks through film 20 and possibly layer 12 and distorts the charge distribution (distorts both the real and imaginary part of the refractive index distribution) beneath region 15 causing the near field radiation pattern to be asymetric, that is, the near field radiation pattern 15' extends toward the right to provide a non-gaussian distribution as shown in FIG. 2b. That distortion causes the output beam to scan to the right. Likewise, when $I_3$ is increased from zero to values below threshold (with $I_2$ remaining zero or very small), a portion of $I_3$ leaks through film 20 and possibly layer 12 and again distorts the radiation pattern 15', this time extending the radiation pattern to the left to provide a non-gaussian distribution as shown in FIG. 2c. The latter distortion causes the output beam to scan to the left.

Instead of electrode 36 receiving a pump current above threshold, either electrode 34 or 38 may receive a pump current above threshold. In this situation, the radiation pattern produced can be scanned toward the center by changing the current applied to electrode 36 (but not allowing the current to electrode 36 to reach threshold.)

The scanner of FIG. 1 can be made by conventional techniques. First layers 6, 8, 10 and 12 are grown by liquid phase expitaxy techniques on substrate 4. After depositing layer 18 on layer 12, the stripe opening pattern is formed through layer 18 (which may be $Si_3N_4$) by photolithography and plasma etch techniques or equivalent techniques. Next, a p-type dopent such as zinc is diffused into layer 12 to convert the n-type and form regions 14, 15 and 16. A metalization, which may be Cr (200 Å) for film 20 and Au (2500 Å) for contacts 34, 36 and 38, is then evaporated onto the p-side of the device. Then, one or both metalized layers may be removed in wide stripes (3 um) along the entire length of the laser, thereby allowing the contacts 34, 36 and 38 to be independently addressed.

The thicknesses and doping density of layers 6, 8, 10 and 12 can be as follows: layer 6, thickness $\sim 3$ um, doping density $\sim 3 \times 10^{17}$ $cm^{-3}$; layer 8, thickness $\sim 0.2$ um, doping density $\sim 10^{17}$ $cm^{-3}$; layer 10, thickness $\sim 2$ um, doping density $\sim 4 \times 10^{17}$ $cm^{-3}$; layer 12, thickness $\sim 0.3$ um, doping density $\sim 3 \times 10^{17}$ $cm^{-3}$. Although the scanner has been described in the context of a double heterostructure laser, other laser structures such as single heterojunction and distributed feedback geometries can be used. Also, the striping can be performed by other than diffusion techniques, such as by oxide stripe, proton stripe and planar stripe.

Figure 3:
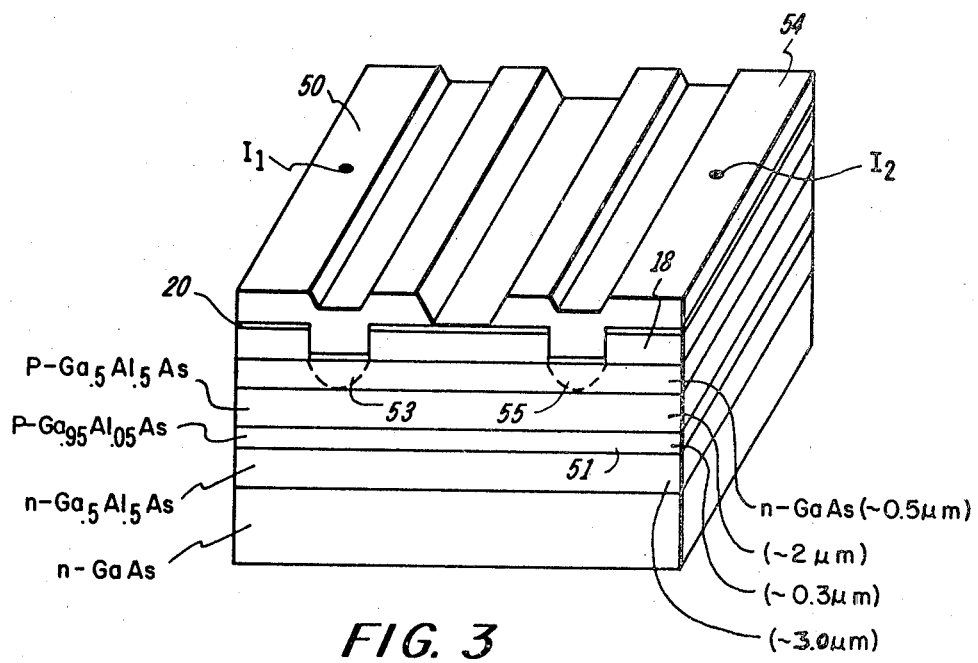

The laser described heretofore achieves scanning of a single-lobe radiation pattern by pumping one laser area beyond threshold and pumping another laser area to distort the charge distribution of the laser area pumped beyond threshold. Single-lobe radiation pattern scanning can be achieved by differentially pumping two or more stripe laser areas at or above threshold such that the laser beam is positioned between the stripes. Such a laser scanner is depicted in FIG. 3, with electrode 50 providing pump current to one portion of active region layer 51 via p-type region 53 and with electrode 54 providing pump current to another portion of active region layer 51 via p-type region 55. The layer compositions and thicknesses of the scanner of FIG. 3 can be those shown in FIG. 3, and materials corresponding to like materials of FIG. 1 have the same reference numerals as those of FIG. 1.

Angular scanning is achieved by the twin stripe scanner of FIG. 3 by varying the ratio $I_1/I_2$, where $I_1$ and $I_2$ are both above or near threshold. With both stripe contacts 50 and 54 pumped simultaneously, thresholds of a 685 um long laser range between 250 mA $< I_1 + I_2 <$ 300 mA depending on $I_1/I_2$. With variations in the $I_1/I_2$ ratio from approximately 0.1 to 10, the far-field single-lobe radiation pattern shifts between $-14$ degrees and $+14$ degrees with a beam width of approximately 6 degrees.

Figure 5:
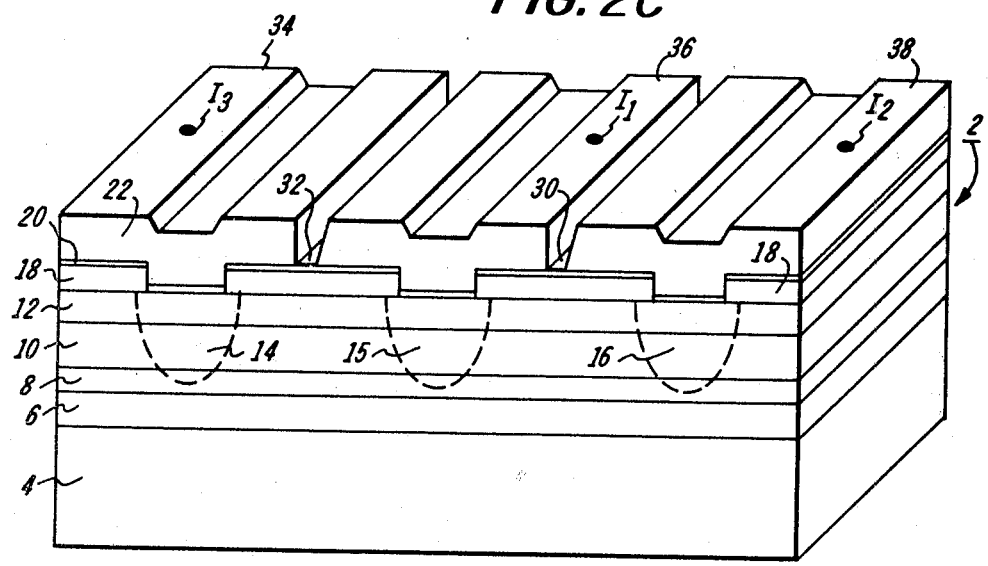
FIGS. 3 and 5 are pictorial views of other laser scanner embodiments of the invention.

The laser geometries described thus far rely on forward biased integrated currents to distort the charge distribution in the vacinity of the laser beam to accomplish scanning. Reversed biased contacts can also be used to change the charge distribution as illustrated in FIG. 5. The laser scanner of FIG. 5 is identical to that of FIG. 1 except that layers 8 and 10 are n-type and diffused regions 14, 15 and 16 extend down into layer 8. When region 15 is forward biased above threshold and no voltage is applied to regions 14 and 16, the charge distribution pattern is symmetric and the beam produced emerges normal to the mirrored or cleaved faces of the laser. However, if a negative bias is applied to region 14 or 16 the charge distribution pattern will be asymmetric and the beam produced will be deflected away from the region to which the negative potential is applied.

Figure 6:
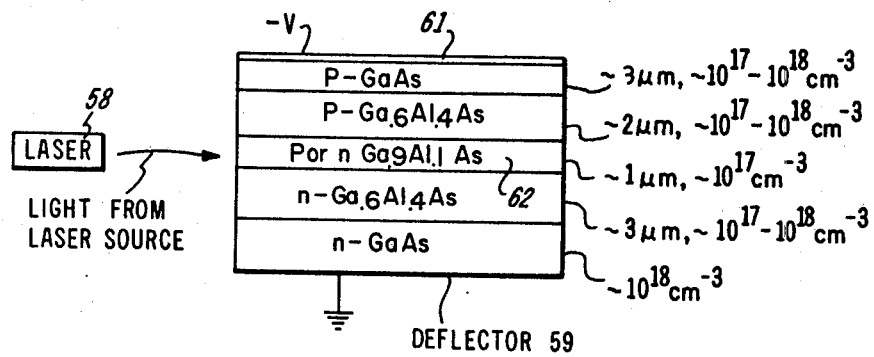
FIGS. 6 and 6a show another laser scanner embodiment in accordance with the invention.
Figure 6A:
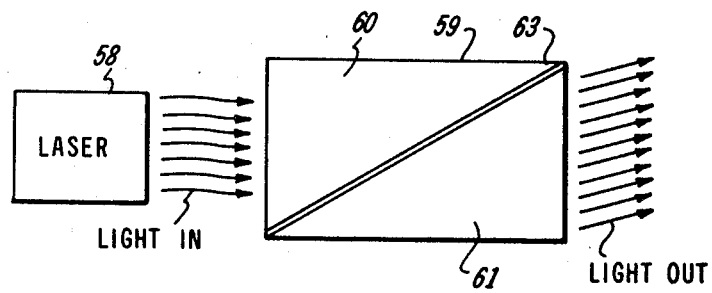

FIGS. 6 and 6a show another possible embodiment for scanning a lager beam by means of asymmetric electrical charge distribution. In this embodiment light from a single laser source, which may or may not be integrated onto the same substrate as the deflector, is coupled to the deflector. The wavelength of the light emitted by the laser source 58 should be such that it is not absorbed in the deflector 59, a laser with a GaAs active region would be such a source when the deflector consists of layers having the compositions, thicknesses, and dopings shown in FIG. 6. As shown in FIG. 6a, which is a top view of FIG. 6, the deflection contacts 60 and 61 can be triangular with an electrical isolation region 63 therebetween provided, for example, by proton bombardment into the active region 62 or by other conventional means.

In operation of the scanner of FIG. 6, when contact 60 is more negatively biased than contact 61 a higher refractive index exists beneath contact 60 than beneath contact 61. Because of that refractive index difference and the triangular shape of contact 60 which makes it act as a variable refractive index prism, the output light is deflected in the direction of contact 60 and electrically controlled scanning is thereby implemented. Likewise, when contact 61 is more negatively biased than contact 60, deflection in the direction of contact 61 is achieved. Although the scanner of FIG. 6 has been described with reference to a double heterostructure deflector, other deflector configurations could be used provided that they do not absorb the incident input light.

The scanners described can be used in an optical disk system in order to track data areas on the disk. In this mode of operation the current leads would be sequentially pulsed such that the laser beam would scan with time across the optical disk.

We claim:

1. A light beam scanner for scanning a single-lobe radiation pattern comprising:
   first means for producing a coherent light beam having a single-lobe radiation pattern, and
   second means proximate to said first means and including a solid state rectifying junction for producing an electrically variable asymmetric refractive index profile through which at least a portion of said radiation pattern propogates whereby said radiation pattern is scanned.

2. The scanner of claim 1 wherein said asymmetric refractive index profile is varied by forward biasing said rectifying junction.

3. The scanner of claim 1 wherein said asymmetric refractive index profile is varied by reverse biasing said rectifying junction.

4. A monolithic light beam scanner for scanning a single-lobe radiation pattern comprising:
   first means for producing a coherent light beam having a single-lobe radiation pattern, and
   second means proximate to said first means and including a solid state rectifying junction for producing an electrically variable asymmetric refractive index profile through which at least a portion of said radiation pattern propogates whereby said radiation pattern is scanned.

5. The monolithic scanner of claim 4 wherein said asymmetric refractive index profile is varied by forward biasing said rectifying junction.

6. The monolithic scanner of claim 4 wherein said asymmetric refractive index profile is varied by reverse biasing said rectifying junction.

* * * * *